United States Patent [19]
Kadomura

[11] Patent Number: 5,994,226
[45] Date of Patent: Nov. 30, 1999

[54] DRY ETCHING METHOD

[75] Inventor: Shingo Kadomura, Kanagawa, Japan

[73] Assignee: Sony Corporation, Tokyo, Japan

[21] Appl. No.: 08/712,572

[22] Filed: Sep. 13, 1996

Related U.S. Application Data

[63] Continuation of application No. 08/298,165, Aug. 30, 1994, abandoned.

[30] Foreign Application Priority Data

Sep. 13, 1993 [JP] Japan .................. P05-227132

[51] Int. Cl.$^6$ .................................................. H01L 21/302
[52] U.S. Cl. .................... 438/695; 438/696; 438/717; 438/720
[58] Field of Search ..................... 438/694, 695, 438/696, 717, 725, 720, 714, 736; 156/659.11, 661.11, 643.1, 646.1, 662.1; 216/102; 437/225

[56] References Cited

U.S. PATENT DOCUMENTS

| | | | |
|---|---|---|---|
| 5,207,868 | 5/1993 | Shinohara | 156/656 |
| 5,217,570 | 6/1993 | Kadomura | 11/643 |
| 5,236,549 | 8/1993 | Shirakawa et al. | 156/643 |
| 5,266,157 | 11/1993 | Kadomura | 156/659.1 |
| 5,268,070 | 12/1993 | Nagayama et al. | 156/662 |
| 5,277,757 | 1/1994 | Sato | 156/643 |
| 5,326,431 | 7/1994 | Kadomura | 156/659.1 |
| 5,369,053 | 11/1994 | Fang | 437/194 |
| 5,391,244 | 2/1995 | Kadomura | 156/659.1 |
| 5,436,205 | 7/1995 | Hirose | 437/228 |

FOREIGN PATENT DOCUMENTS

| | | |
|---|---|---|
| 368732 | 5/1990 | European Pat. Off. . |
| 0 517 165 | 12/1992 | European Pat. Off. . |
| 0 555 858 | 2/1995 | European Pat. Off. . |
| 41 30 391 | 3/1992 | Germany . |
| 57-181378 | 11/1982 | Japan . |
| 3-110846 | 5/1991 | Japan . |

OTHER PUBLICATIONS

Patent Abstract of Japanese Published Application 4–330724 of Nov. 18, 1992, Patent Abstracts of Japan, vol. 17, No. 174, (E–1349) Apr. 5, 1993.

*Primary Examiner*—Thi Dang
*Assistant Examiner*—George Goudreau
*Attorney, Agent, or Firm*—Hill & Simpson

[57] ABSTRACT

A dry etching method for a conductive material layer is disclosed. The dry etching method has the steps of: forming an oxygen-containing antireflection film on a surface of a conductive material layer; forming a patterned mask layer on the antireflection film; forming a sidewall protection film on a sidewall of the mask layer; and etching the conductive material layer using the mask layer having the sidewall protection film formed thereon. The sidewall protection film is formed after the antireflection film is patterned using the mask layer. The antireflection film is patterned after the sidewall protection film is formed, with the sidewall protection film left on the sidewall of the antireflection film. The sidewall protection film is formed by using at least one of sulfur based compound and sulfur nitride based compound. The antireflection film is composed of an SiON based material. The conductive material layer is composed of a material selected from the group consisting of a polycide film, an Al based alloy material layer, a Cu based alloy material layer and a refractory metal layer. The conductive material layer is formed on a semiconductor substrate having an insulating film formed on a surface thereof. The conductive material layer is formed on an insulating film having a barrier metal layer formed on a surface thereof.

15 Claims, 5 Drawing Sheets

DRY ETCHING METHOD

This is a continuation, of application Ser. No. 08/298,165, filed Aug. 30, 1994.

BACKGROUND OF THE INVENTION

1. Field of the Invention

This invention relates to a dry etching method adapted for fine processing of manufacturing a semiconductor device, and particularly to a method for preventing regression of a resist mask formed on an SiON based antireflection film so as to improve anisotropy.

2. Description of Related Art

In order to realize large scale integration of semiconductor devices, the minimum processing size of the circuit pattern formation has been rapidly diminished. For instance, the minimum processing size of the 16M DRAM of approximately 0.5 $\mu$m (half micron), the minimum processing size of the 64M DRAM of 0.35 $\mu$m (sub-half micron), and the minimum processing size of the 256M DRAM of 0.25 $\mu$m (quarter micron) are required.

This increasingly fine processing depends largely upon a technique of photolithography to form a mask pattern. Visible to near ultraviolet rays, such as g rays having a wavelength of 436 nm or i rays having a wavelength of 365 nm, of a high pressure mercury lamp are used for the current 0.5-$\mu$m class processing, and far ultraviolet rays, such as KrF excimer laser lights having a wavelength of 248 nm, are used for 0.35 to 0.25-$\mu$m class processing. In the photolithography technique for forming a fine mask with a ray width of not greater than 0.4 $\mu$m, an antireflection film to weaken a reflected light from an underlying material layer is substantially required for preventing reduction in contrast and resolution due to halation and standing wave effect.

As the component material of the antireflection film, amorphous silicon, TiN and TiON are conventionally used. However, since it has been shown that SiON (silicon oxide nitride) exhibits satisfactory optical properties in the far ultraviolet region, application of SiON to the excimer laser lithography is proposed. It is exemplified by a process of fine gate processing with an SiON film restraining the reflectivity of a W (tungsten)—polycide film or an Al (aluminum) based material film.

Meanwhile, after the patterning of the resist mask by such photolithography is finished, the antireflection film is etched in the subsequent etching process.

In this case, such a problem is now being apparent that the anisotropic shape of the underlying material layer may be deteriorated by oxygen discharged from SiON in the etching process, particularly in overetching. This problem is explained with reference to FIGS. 1 to 4.

FIG. 1 shows a state of a wafer prior to the etching, in which a gate $SiO_x$ film 22, a W-polycide film 25 and an SiON antireflection film 26 are sequentially stacked on an Si substrate 21, with a resist mask 27 patterned in a predetermined shape being formed thereon. The W-polycide film 25 is composed of, from the bottom, a polysilicon layer 23 containing impurities and a $WSi_x$ (tungsten silicide) layer 24 which are sequentially stacked.

If the W-polycide film 25 is etched using a $Cl_2/O_2$ mixed gas, the etching is promoted by a formation of etching reaction products, such as $SiCl_x$ and $WClO_x$. On the other hand, a carbon based polymer derived from decomposition products provided by forward sputtering of the resist mask is deposited to form a sidewall protection film 28 on the sidewall surface of the pattern. If the wafer temperature is sufficiently low, $SiCl_x$ of relatively low vapor pressure among the etching decomposition products can be a component of the sidewall protection film 28.

As a result, a gate electrode 25a of anisotropic shape is formed at the end of just etching, as shown in FIG. 2. In FIG. 2, materials after the etching are denoted by their respective original numerals plus subscripts "a".

However, if the overetching follows the just etching, regression of the edge of the resist mask 27 causes the SiON antireflection film 26a to have its end surface tapered to be easily exposed, as shown in FIG. 3. SiON, having an element composition ratio of approximately Si:O:N=2:1:1, is richer in Si than $SiO_2$ is. Consequently, SiON has low durability to a Cl based plasma, and easily discharges active O* when its exposed end surface is etched. Then, O* removes the sidewall protection film 28 in the form of $CO_x$, to lower sidewall protection effects. In addition, since the W-polycide film 25 to be etched is reduced in the overetching, a relatively excessive amount of O* is present in the etching gas.

As a result, a gate electrode 25b having an undercut is formed, as shown in FIG. 4. The material layers having the undercut denoted by their respective original numerals plus subscripts "b". The undercut is generated most conspicuously in the $WSi_x$ layer 24b. Since O* sputtered out from the end surface of the SiON antireflection film removes W atoms in the form of $WClO_x$, the etchrate in the $WSi_x$ 24a is increased.

As the anisotropic shape of the gate electrode is thus deteriorated, serious problems rise, such as, the metallization resistance falling off the designed value and difficulty in forming the sidewall to attain an LDD structure.

The deterioration in the anisotropic shape in the overetching is not limited to the above-described SiON antireflection film, but is a phenomenon which may be generated in cases where an antireflection film capable of easily discharging oxygen is used and where conductive material layers of Al based metallization and the like other than the W-polycide film are used as etching targets.

OBJECT AND SUMMARY OF THE INVENTION

It is therefore an object of the present invention to provide a method of maintaining anisotropy even in the overetching in the etching of a conductive material layer stacked on an oxygen-containing antireflection film.

Through intensive studies for achieving the above object, the present inventor has considered that it is necessary to reinforce the etching durability of the sidewall surface of the resist mask to prevent a horizontal regression of the mask it, in order to prevent the end surface of the antireflection film from being tapered as described above. The present inventor has also considered it effective, as a reinforcing measure, to form a sidewall protection film on the sidewall surface of the resist mask at least before the essential portion of the etching of the conductive material layer starts. The present inventor has thus reached the present invention.

According to the present invention, there is provided a dry etching method for a conductive material layer having the steps of: forming an oxygen-containing antireflection film on a surface of a conductive material layer; forming a patterned mask layer on the antireflection film; forming a sidewall protection film on a sidewall of the mask layer; and etching the conductive material layer using the mask layer having the sidewall protection film formed thereon.

The sidewall protection film may be formed after the antireflection film is patterned using the mask layer.

The antireflection film may be patterned after the sidewall protection film is formed, and a second or additional sidewall protection film is left or formed on the sidewall of the antireflection film.

The sidewall protection film is formed by using at least one compound selected from a group consisting of a sulfur based compound and a sulfur nitride based compound.

The antireflection film is composed of an SiON based material.

The conductive material layer is composed of a material selected from the group consisting of a polycide film, an Al based alloy material layer, a Cu based alloy material layer and a refractory metal layer.

The conductive material layer may be formed on a semiconductor substrate having an insulating film formed on a surface thereof.

The conductive material layer may be formed on an insulating film having a barrier metal layer formed on a surface thereof.

According to the present invention, there is also provided a dry etching method for a conductive material layer having the steps of: forming an oxygen-containing antireflection film on a surface of a conductive material layer; forming a patterned mask layer on the anti-reflection film; patterning the antireflection film using the mask layer to expose a selected portion of the conductive material layer; forming sidewall protection films on sidewalls of the mask layer and the antireflection film using deposit reaction products formed by a reaction of the exposed portion of the conductive material layer with a plasma; and etching the conductive material layer using the mask layer having the sidewall protection film formed thereon.

The conductive material layer is composed of a material selected from the group consisting of a polycide film, an Al based alloy material layer, a Cu based alloy material layer and a refractory metal layer.

The antireflection film is composed of an SiON based material.

The conductive material layer may be formed on a semiconductor substrate having an insulating film formed on a surface thereof.

The conductive material layer may be formed on an insulating film having a barrier metal layer formed on a surface thereof.

In the present invention, since the sidewall protection film is formed on the sidewall of the mask layer before at least the essential portion of the etching of the conductive material layer starts, the mask Layer does not regress during the etching of the conductive material layer. Thus, exposition of the selected portion of the antireflection film can be prevented, and oxygen active species are not discharged even when an oxygen-containing antireflection film such as SiON is used. Consequently, the sidewall protection film formed on the sidewall of the conductive material layer is not removed in the overetching, thus maintains a satisfactory anisotropic shape.

Particularly, if the sidewall protection film is formed after the etching of the antireflection film, the pattern sidewall of the antireflection film as well as the sidewall of the mask layer are protected by the sidewall protection film, and therefore the effect of oxygen discharge prevention is further improved.

If the sidewall protection film is formed by using at least either a sulfur or a sulfur nitride based compound, a process generating an extremely small amount of particles can be realized.

If the sidewall protection film is formed by using the reaction product derived from the conductive material layer, the type of chemical species relating to the etching reaction is limited, thus realizing easy control, analysis and maintenance.

DESCRIPTION OF THE PREFERRED EMBODIMENTS

Preferred embodiments of the present invention will now be described in detail.

Embodiment 1

In the present embodiment, an SiON antireflection film on the surface of a W-polycide gate electrode was etched, and then a sidewall protection film composed of $(SN)_x$ was formed on a sidewall surface of a resist mask. The process is explained with reference to FIGS. 5 to 9.

Figure 1:
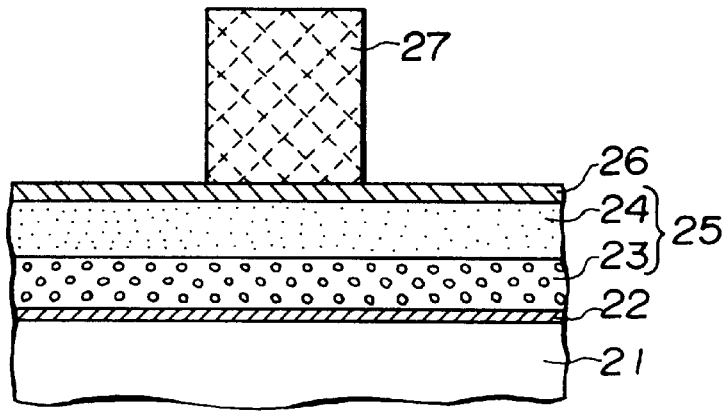
FIG. 1 is a cross-sectional view showing a state of a wafer before etching in the conventional W-polycide gate electrode processing.
Figure 2:
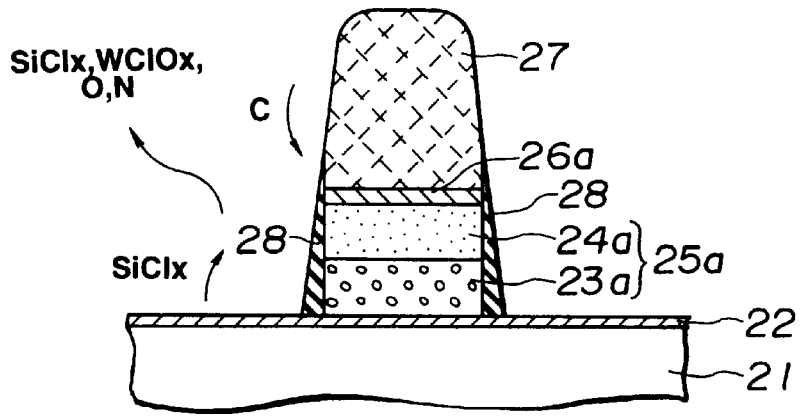
FIG. 2 is a cross-sectional view showing a state in which an SiON antireflection film and a W-polycide film of FIG. 1 are etched by just etching.
Figure 3:
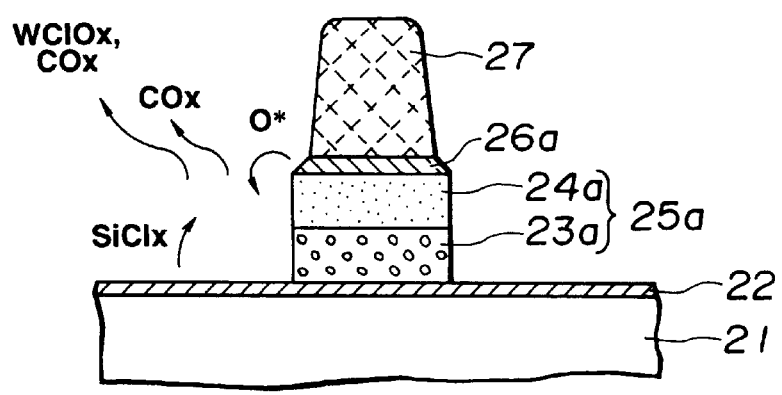
FIG. 3 is a cross-sectional view showing a state in which a resist mask of FIG. 2 regresses through overetching.
Figure 4:
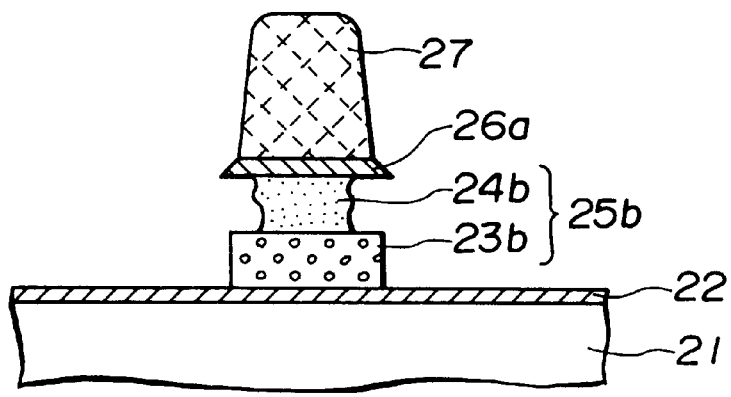
FIG. 4 is a cross-sectional view showing a state in which the anisotropic shape of a gate electrode of FIG. 3 is deteriorated.
Figure 5:
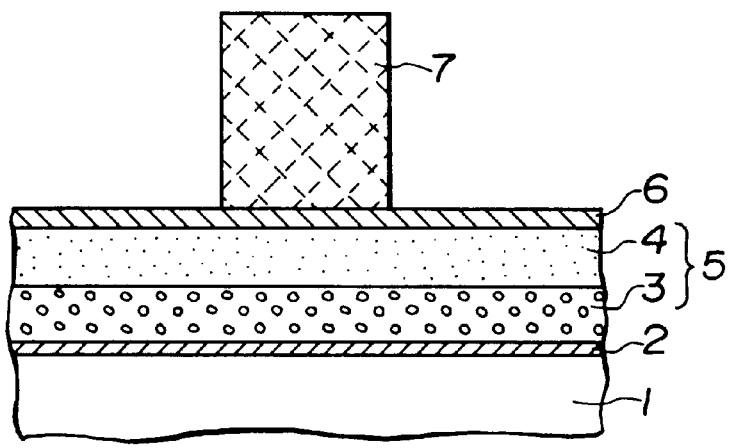
FIG. 5 is a cross-sectional view showing a state of a wafer before etching in W-polycide gate electrode processing according to the present invention.

FIG. 5 shows the structure of a wafer used as an etching sample in the present embodiment. A gate oxide film 2 having a thickness of approximately 10 nm, a W-polycide film 5 and an SiON antireflection film 6 are sequentially stacked on an Si substrate 1, with a resist mask 7 patterned in a predetermined shaped being formed thereon.

The W-polycide film 5 includes, from the bottom, a polysilicon layer 3 containing impurities and having a thickness of approximately 100 nm and a $WSi_x$ layer 4 having a thickness of approximately 100 nm, which are sequentially stacked. The SiON antireflection layer 6 is deposited with a thickness of approximately 30 nm by the plasma CVD method. In addition, the resist mask 7 is formed with a thickness of approximately 1 μm and a pattern width of approximately 0.25 μm, using a positive chemical amplification resist material, XP8843 (trade name) produced by Shipley, and a KrF excimer laser stepper.

The wafer was set on an RF-biased magnetically enhanced microwave plasma etcher, and the SiON antireflection film 6 was etched under the following conditions:

| | |
|---|---|
| c-$C_4F_8$ flow rate | 50 SCCM |
| $CHF_3$ flow rate | 20 SCCM |
| gas pressure | 0.4 Pa |
| microwave power | 850 W (2.45 GHz) |
| RF bias power | 200 W (800 kHz) |
| wafer setting electrode temperature | −50° C. |

Figure 6:
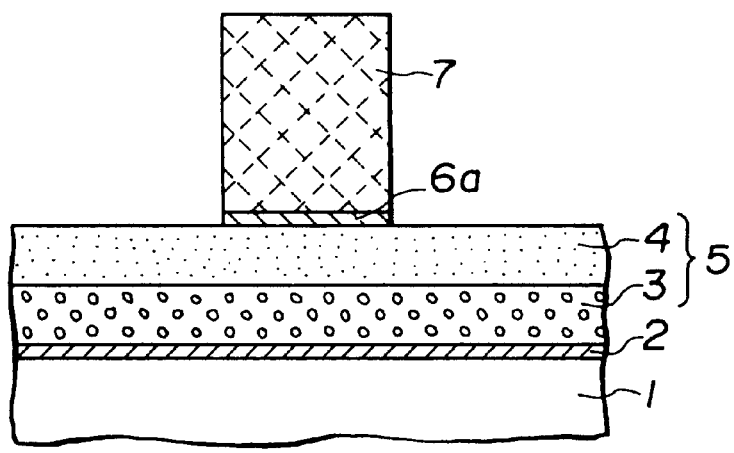
FIG. 6 is a cross-sectional view showing a state in which an SiON antireflection film of FIG. 5 is etched.

In this etching process, an SiON antireflection film 6a as shown in FIG. 6 was produced. In this etching process based upon an ion-assisted mechanism of $CF_x^+$, the content of O of SiON is smaller than in $SiO_2$, and therefore carbon based polymer derived from the fluorocarbon based gas is likely to be deposited. Consequently, the etchrate in this case is approximately one-third the etchrate of $SiO_2$ under the same conditions.

The wafer was set on another magnetically enhanced microwave plasma etcher, and electric discharge was carried out under the following conditions:

| | |
|---|---|
| $S_2Cl_2$ flow rate | 10 SCCM |
| $N_2$ flow rate | 10 SCCM |
| gas pressure | 0.3 Pa |
| microwave power | 850 W (2.45 GHz) |
| RF bias power | 0 w |
| wafer setting electrode temperature | 0° C. |

Figure 7:
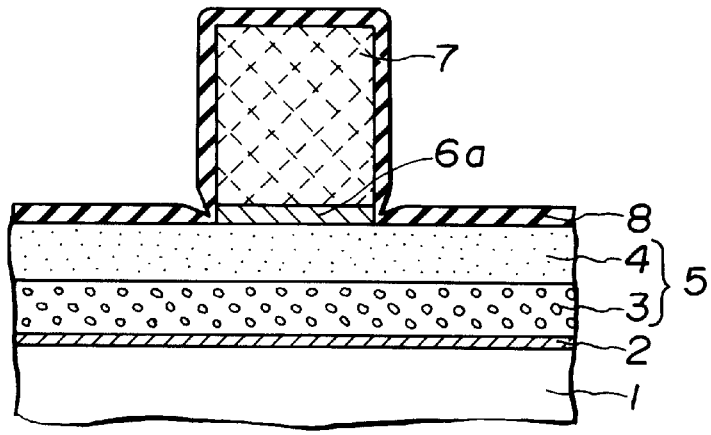
FIG. 7 is a cross-sectional view showing a state in which the entire surface of a wafer of FIG. 6 is covered with a deposit layer.

Through this electric discharge, the entire surface of the wafer was covered with a deposit layer 8 composed of a sulfur nitride based compound, as shown in FIG. 7. The deposit layer 8 consists mainly of polythiazyl $(SN)_x$.

The deposit layer 8 was then etched back under the following conditions:

| | |
|---|---|
| $Cl_2$ flow rate | 20 SCCM |
| gas pressure | 0.3 Pa |
| microwave power | 850 W (2.45 GHz) |
| RF bias power | 100 W (2 MHz) |
| wafer setting electrode temperature | 0° C. |

Figure 8:
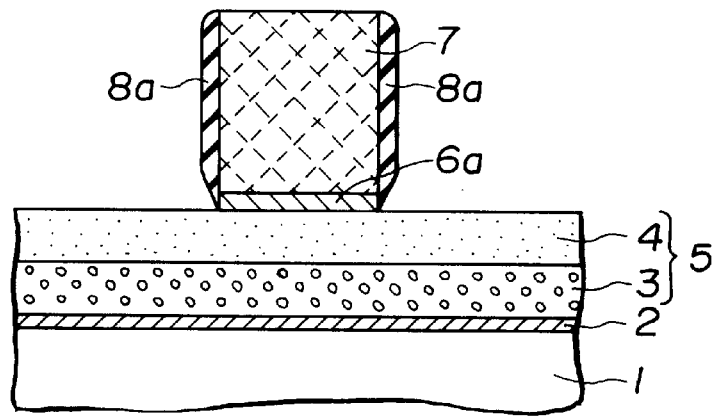
FIG. 8 is a cross-sectional view showing a state in which sidewall protection film of a resist mask is formed by etching back the deposit Layer of FIG. 7.

Through this etching back, the deposit layer 8 remained only on the sidewall surface of the resist mask 7 and SiON antireflection film 6a, so as to form a sidewall protection film 8a, as shown in FIG. 8.

The wafer was then set on another magnetically enhanced microwave plasma etcher for gate processing, and the W-polycide film 5 was etched. This etching was carried out in two-step processes using optimum etching conditions for etching the $WSi_x$ layer 4 and the polysilicon layer 3, respectively.

The exemplary etching conditions are shown as follows:
[Etching conditions of $WSi_x$ layer 4]

| | |
|---|---|
| $Cl_2$ flow rate | 20 SCCM |
| $O_2$ flow rate | 3 SCCM |
| gas pressure | 0.3 Pa |
| microwave power | 850 W (2.45 GHz) |
| RF bias power | 30 W (2 MHz) |
| wafer setting electrode temperature | 0° C. |

In this process, the $WSi_x$ was quickly removed in the form of $WClO_x$, and $SiCl_x$.

[Etching conditions of polysilicon layer 3]

| | |
|---|---|
| HBr flow rate | 20 SCCM |
| gas pressure | 0.3 Pa |
| microwave power | 850 W (2.45 GHz) |
| RF bias power | 10 W (2 MHz) |
| wafer setting electrode temperature | 0° C. |

In this process, high selectivity to the gate oxide film 2 was achieved by using a Br based etchant and employing low bias conditions. Overetching of approximately 50% was carried out also under these conditions.

Figure 9:
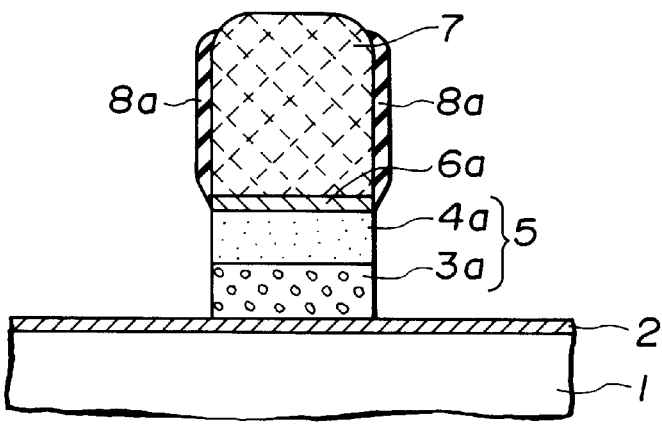
FIG. 9 is a cross-sectional view showing a state in which a gate electrode is formed by anisotropically etching the W-polycide film of FIG. 8.

Since the resist mask 7 had its sidewall surface protected during the two-step etching of the W-polycide film 5 and the overetching, the resist mask 7 suffered no horizontal regression. Consequently, the end surface of the SiON antireflection film 6a is not exposed, and removal of carbon based polymer, not shown, and accelerating etching of the $WSi_x$ layer 4 did not proceed. As a result, a gate electrode 5a having a satisfactory anisotropic shape was formed as shown in FIG. 9. In FIG. 9, the material layers after the etching are denoted by their respective original numerals plus subscripts "a".

Meanwhile, the prevention of the horizontal regression of the resist mask by covering the sidewall surface of the resist mask with the deposit has been known. For instance, it is reported in the Extracts of the 39th Applied Physics Relations Association Lectures, Spring 1992, page 504, the Lecture No. 28p-NC-4, that the regression of the resist mask was prevented to restrict dimensional changes by covering the resist mask with an $SiO_2$ based material in Si etching using an $HBr/O_2$ mixed gas. In this case, however, it is impossible to remove the resist mask without dissolving to remove the $SiO_2$ based material through dilute hydrofluoric acid processing before the conventional ashing.

On the contrary, the sulfur nitride based compound used as the component material of the sidewall protection film in the present embodiment can be removed through sublimation due to heating or combustion due to ashing, and therefore does not obstruct the conventional resist removing process.

Embodiment 2

In the present embodiment, a sidewall protection film composed of $(SN)_x$ was formed on the sidewall surface of a resist mask before an SiON antireflection film was etched in the W-polycide gate electrode processing similar to the above embodiment. This process is explained with reference to FIGS. 10 and 11.

Figure 10:
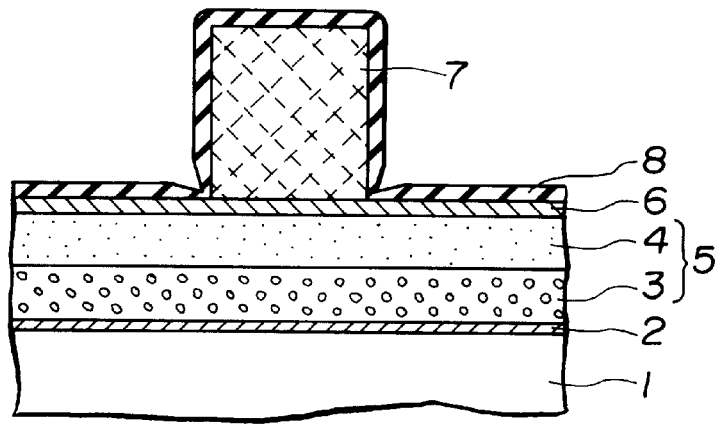
FIG. 10 is a cross-sectional view showing a state in which the entire surface of the wafer of FIG. 5 is covered with a deposit layer in another W-polycide gate electrode processing according to the present invention.
Figure 11:
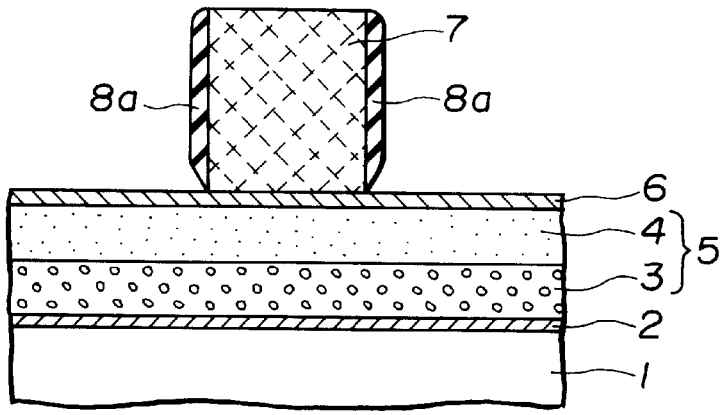
FIG. 11 is a cross-sectional view showing a state in which a sidewall protection film of a resist mask is formed by etching back the deposit layer of FIG. 10.

In the present embodiment, a deposit layer 8 composed of a sulfur nitride based compound was deposited on the entire surface of the wafer shown in FIG. 5 by a technique similar to that of Embodiment 1, so as to be in a state shown in FIG. 10, and then the deposit layer 8 was etched back to form a sidewall protection film 8a as shown in FIG. 11. The etching conditions of the SION antireflection film 6 and the W-polycide film 5 are as described in Embodiment 1.

In the present embodiment, the sidewall surface of the pattern of the SiON antireflection film 6 was not covered with the sidewall protection film 8a. However, since the sidewall surface was rarely sputtered to discharge O* under anisotropic etching conditions, a gate electrode 5a having a satisfactory anisotropic shape was formed.

Embodiment 3

In the present embodiment, an SiON antireflection film on the surface of an Al-1% Si layer was etched, and then $AlBr_x$ was formed from the surface layer of the Al-1% Si layer using a Br based etchant so as to be used as a component of a sidewall protection film, in an Al based metallization processing. This process is explained with reference to FIGS. 12 to 15.

Figure 12:
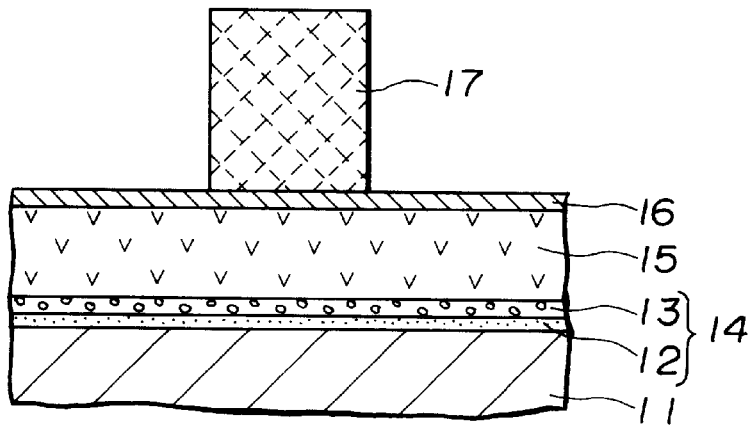
FIG. 12 is a cross-sectional view showing a state of a wafer before etching in Al based metallization processing according to the present invention.

FIG. 12 shows the structure of a wafer used as an etching sample in the present embodiment. A barrier metal 14 composed of a Ti layer 12 and a TiON layer 13 stacked thereon, an Al-1% Si layer 15 and an SiON antireflection film 16 are sequentially stacked on an $SiO_2$ interlayer insulating film 11, with a resist mask 17 patterned in a predetermined shape being formed thereon. The resist mask 17 is formed with a pattern width of approximately 0.25 $\mu$m by excimer laser lithography.

Figure 13:
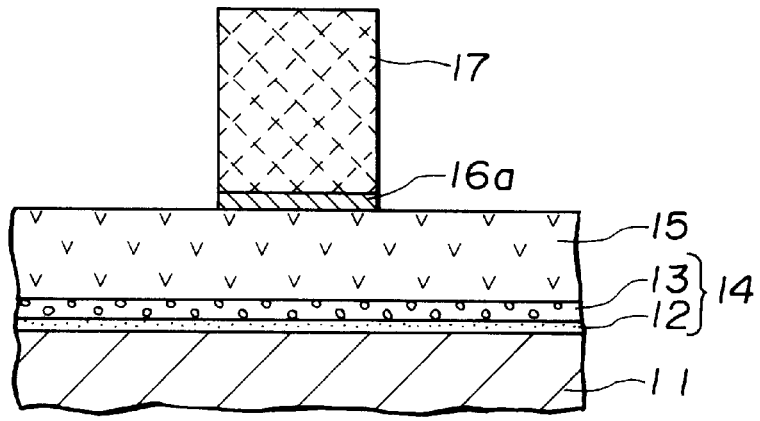
FIG. 13 is a cross-sectional view showing a state in which an SiON antireflection film of FIG. 12 is etched.

The SiON antiireflection film 16 was etched as shown in FIG. 13, using a $c\text{-}C_4F_8/CHF_3$ mixed gas and employing conditions similar to those in Embodiment 1. This etching was carried out with high selectivity to the Al-1% Si layer 15 by using an F based etchant.

Plasma processing was carried out under the following conditions:

| | |
|---|---|
| HBr flow rate | 20 SCCM |
| gas pressure | 1.3 Pa |
| microwave power | 850 W (2.45 GHz) |
| RF bias power | 10 W (2 MHz) |
| wafer setting electrode temperature | 20° C. |

Figure 14:
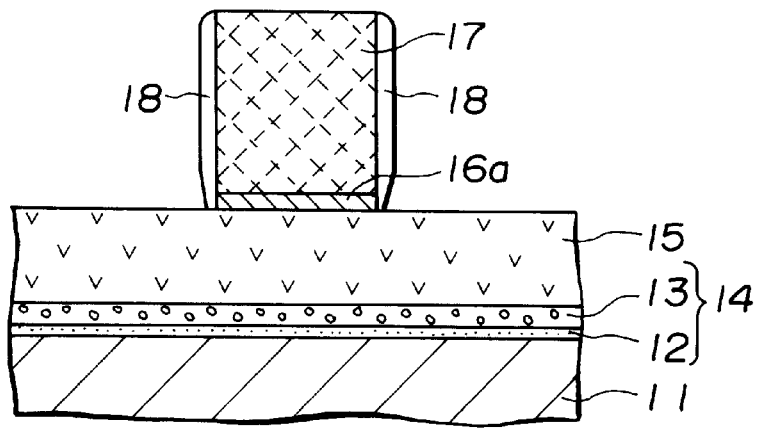
FIG. 14 is a cross-sectional view showing a state in which a sidewall protection film is deposited on the sidewall surface of a resist mask of FIG. 13.

In this plasma processing, $AlBr_x$ of low vapor pressure was formed by a reaction of an HBr plasma with an exposed surface of the Al-1% Si layer 15. However, slight application of an RF bias restricted the deposition of $AlBr_x$ on a vertical ion incident surface. As a result, $AlBr_x$ was deposited only on the pattern sidewall surface, forming a sidewall protection film 18 as shown in FIG. 14.

The Al-1% Si layer 15 and the barrier metal 14 were then continuously etched under the following conditions:

| | |
|---|---|
| $S_2Cl_2$ flow rate | 20 SCCM |
| gas pressure | 1.3 Pa |
| microwave power | 850 W (2.45 GHz) |
| RF bias power | 50 W (2 MHz) |
| wafer setting electrode temperature | 20° C. |

Overetching was carried out subsequently under the same conditions.

Figure 15:
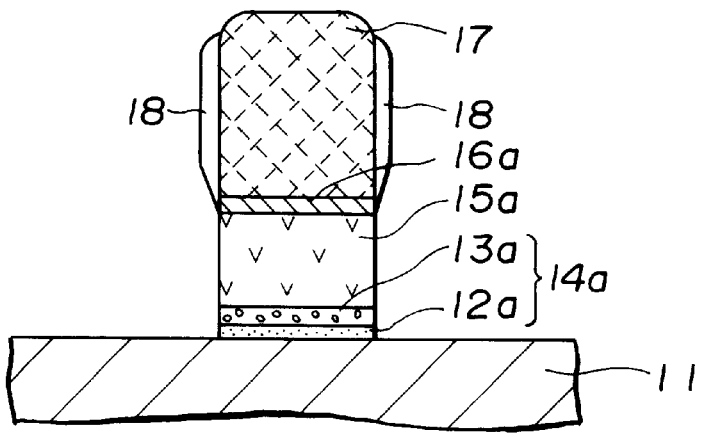
FIG. 15 is a cross-sectional view showing a state in which an Al based metallization pattern is formed by anisotropically etching an Al-1% Si layer and a barrier metal of FIG. 14.

In the etching process and the overetching process, anisotropic etching proceeded with sidewall protection by S (sulfur) dissociated from $S_2Cl_2$, thus producing an Al based metallization pattern 15a and a barrier metal pattern 14a of anisotropic shape as shown in FIG. 15. The material layers after the etching are denoted by their respective original numerals plus subscripts "a".

In the present embodiment, as the horizontal regression of the resist mask 17 was not generated, the end surface of the SiON antireflection film 16a was not exposed. Consequently, S contributing to sidewall protection was not removed in the form of $SO_x$, and the anisotropic shape was maintained even in the overetching.

The present invention is described based upon the above three embodiments. However, it is to be understood that the present invention is not limited to these embodiments, and that details of the structure of the sample wafer, the etcher to be used and the etching conditions may be suitably changed.

What is claimed is:

1. A dry etching method for a conductive material layer comprising the steps of:

forming a first film comprising elements of Si, O and N on a surface of a conductive material layer, said first film having an anti-reflective property;

forming a patterned mask layer on the first film;

forming a sidewall protection film on the mask layer by using at least one compound selected from the group consisting of sulfur-based compounds and sulfur-nitride-based compounds;

then patterning the first film with the sidewall protection film being left on the sidewall of the patterned mask layer; and etching the conductive material layer using the mask layer having the sidewall protection film formed thereon.

2. A dry etching method for a conductive material layer comprising the steps of:

providing a conductive material layer;

forming a first film of SiON on the surface of a conductive material layer, said first film having an anti-reflection property;

forming a patterned mask layer on the first film;

forming a sidewall protection film of at least one compound selected from the group consisting of sulfur-based compounds and sulfur-nitride-based compounds on a sidewall of the mask layer; and then plasma etching the conductive material layer using the mask layer.

3. A dry etching method for a conductive material layer comprising the steps of:

providing a conductive material layer;

forming a first film of SiON on the surface of a conductive material layer, said first film having an anti-reflection property;

forming a patterned mask layer on the first film;

simultaneously forming a sidewall protection film on a sidewall of the mask layer while plasma etching the conductive material layer using the mask layer, said side wall protection film being formed by the reaction products formed by the plasma etching of the conductive layer and containing sulfur based compounds.

4. A dry etching method for a conductive material layer comprising the steps of:

forming a first layer comprising elements of Si, O and N on the surface of a conductive material layer, said first layer having an anti-reflection property;

forming a patterned mask layer on the first layer;

then patterning the first layer with the patterned mask layer;

forming a sidewall protection film on the patterned mask layer and the first layer by using at least one compound selected from the group consisting of sulfur based compounds and sulfur nitride based compounds; and plasma etching the conductive material layer using the mask and the first layer having the sidewall protection film formed thereon.

5. A dry etching method as claimed in claim 2, wherein the conductive material layer is comprised of a material selected from the group consisting of a polycide film, an Al based alloy material layer, a Cu based alloy material layer and a refractory metal layer.

6. A dry etching method as claimed in claim 2, wherein the conductive material layer is formed on a semiconductor substrate having an insulating film formed on a surface thereof.

7. A dry etching method as claimed in claim 2, wherein the conductive material layer is formed on an insulating film having a barrier metal layer formed on a surface thereof.

8. A dry etching method according to claim 2, which includes patterning the first film using the patterned mask layer and the step of forming a sidewall protection film forms the protection film on both the sidewalls of the first film and the mask layer.

9. A dry etching method according to claim 2, which includes patterning the first film after the step of forming the sidewall protection film on the sidewalls of the mask.

10. A dry etching method as claimed in claim 3, wherein the conductive material layer is comprised of a material selected from the group consisting of a polycide film, an Al based alloy material layer, a Cu based alloy material layer and a refractory metal layer.

11. A dry etching method as claimed in claim 3, wherein the conductive material layer may be formed on a semiconductor substrate having an insulating film formed on a surface thereof.

12. A dry etching method as claimed in claim 3, wherein the conductive material layer may be formed on an insulating film having a barrier metal layer formed on a surface thereof.

13. A dry etching method according to claim 4, wherein the step of forming the sidewall protection film and the step of plasma etching the conductive material layer occur simultaneously.

14. A dry etching method according to claim 13, wherein the step of forming sidewall protection film uses reaction products formed by the plasma etching of the conductive layer.

15. A dry etching method according to claim 4, wherein the step of forming the sidewall protection film occurs before the step of plasma etching the conductive material layer.

* * * * *